US012676292B2

(12) United States Patent
Motokawa et al.

(10) Patent No.: US 12,676,292 B2
(45) Date of Patent: Jul. 7, 2026

(54) TARGET PROCESSING DEVICE AND TARGET PROCESSING METHOD

(71) Applicant: Kioxia Corporation, Tokyo (JP)

(72) Inventors: Takeharu Motokawa, Zushi Kanagawa (JP); Noriko Sakurai, Yokohama Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 637 days.

(21) Appl. No.: 18/164,053

(22) Filed: Feb. 3, 2023

(65) Prior Publication Data

US 2024/0096601 A1 Mar. 21, 2024

(30) Foreign Application Priority Data

Sep. 16, 2022 (JP) ................................. 2022-148547

(51) Int. Cl.
*H01J 37/32* (2006.01)
*C01B 32/05* (2017.01)
(Continued)

(52) U.S. Cl.
CPC ........ *H01J 37/32412* (2013.01); *C01B 32/05* (2017.08); *G03F 1/58* (2013.01); *G03F 1/80* (2013.01); *H01J 37/32055* (2013.01); *H01J 37/32357* (2013.01); *H01J 37/32449* (2013.01); *H01J 37/32743* (2013.01); *C01P 2002/02* (2013.01); *H01J 37/32669* (2013.01); *H01J 2237/20235* (2013.01);
(Continued)

(58) Field of Classification Search
CPC ........... H01J 37/32412; H01J 37/32055; H01J 37/32357; H01J 37/32449; H01J
37/32743; H01J 37/32669; H01J
2237/20235; H01J 2237/20278; H01J
2237/24578; H01J 2237/332; H01J
2237/334; H01J 2237/3365; C01B 32/05;
G03F 1/58; G03F 1/80; C01P 2002/02
USPC ............................................................. 430/5
See application file for complete search history.

(56) References Cited

U.S. PATENT DOCUMENTS 9,576,811 B2 2/2017 Kanarik et al.
10,515,815 B2 12/2019 Zhou et al.
(Continued)

FOREIGN PATENT DOCUMENTS

JP 2008-291344 A 12/2008
JP 2016131238 A 7/2016
(Continued)

OTHER PUBLICATIONS

U.S. Appl. No. 17/902,745, filed Sep. 2, 2022.
(Continued)

*Primary Examiner* — Caleen O Sullivan
(74) *Attorney, Agent, or Firm* — Kim & Stewart LLP

(57) ABSTRACT

A target processing method includes: importing a target into a processing chamber; forming a film including carbon on the target using at least one of first ion including carbon and a first plasma including carbon; and removing the film by a reaction between a second plasma and the film, wherein the forming of the film and the removing of the film are alternately performed a number of times in the processing chamber without removing the target from the processing chamber.

8 Claims, 14 Drawing Sheets

(51) Int. Cl.

| | | |
|---|---|---|
| *G03F 1/58* | (2012.01) | |
| *G03F 1/80* | (2012.01) | |

(52) U.S. Cl.
CPC ................ *H01J 2237/20278* (2013.01); *H01J 2237/24578* (2013.01); *H01J 2237/332* (2013.01); *H01J 2237/334* (2013.01); *H01J 2237/3365* (2013.01)

(56) References Cited

U.S. PATENT DOCUMENTS

| | | | |
|---|---|---|---|
| 10,559,461 B2 | 2/2020 | Reddy et al. | |
| 10,658,174 B2 | 5/2020 | Zhou et al. | |
| 10,734,238 B2 | 8/2020 | Zhou et al. | |
| 2008/0293248 A1 | 11/2008 | Park | |
| 2017/0170065 A1* | 6/2017 | Kitamura | C23C 16/46 |
| 2018/0197720 A1 | 7/2018 | Morikita | |
| 2019/0157096 A1* | 5/2019 | Zhou | H10D 30/024 |
| 2021/0291408 A1 | 9/2021 | Motokawa | |
| 2022/0199417 A1 | 6/2022 | Henri | |
| 2022/0291581 A1 | 9/2022 | Motokawa | |
| 2024/0043142 A1* | 2/2024 | Gorokhovsky | B64G 1/413 |

FOREIGN PATENT DOCUMENTS

| | | | |
|---|---|---|---|
| JP | 2018182322 A | 11/2018 | |
| JP | 6552849 B2 | 7/2019 | |
| JP | 2021504972 A | 2/2021 | |
| JP | 2021504973 A | 2/2021 | |
| JP | 2021504974 A | 2/2021 | |
| JP | 2022-526124 A | 5/2022 | |

OTHER PUBLICATIONS

Japanese Office Action dated Nov. 11, 2025 in corresponding Japanese Patent Application 2022-148547 with English Translation, 10 pages.
Chinese Office Action dated Jan. 31, 2026 in corresponding Chinese Patent Application 202310176633.7 with English Translation, 24 pages.

* cited by examiner

TARGET PROCESSING DEVICE AND TARGET PROCESSING METHOD

CROSS-REFERENCE TO RELATED APPLICATION

This application is based upon and claims the benefit of priority from Japanese Patent Application No. 2022-148547, filed Sep. 16, 2022, the entire contents of which are incorporated herein by reference.

FIELD

Embodiments described herein relate generally to a target processing device and a target processing method.

BACKGROUND

In recent years, technologies for processing surfaces of targets using target processing devices such as target substrate devices are known.

DESCRIPTION OF THE DRAWINGS

FIG. 9 is a schematic view illustrating a configuration example of a target processing device;

FIG. 15 is a schematic view illustrating still another configuration example of a target processing device;

DETAILED DESCRIPTION

Figure 1:
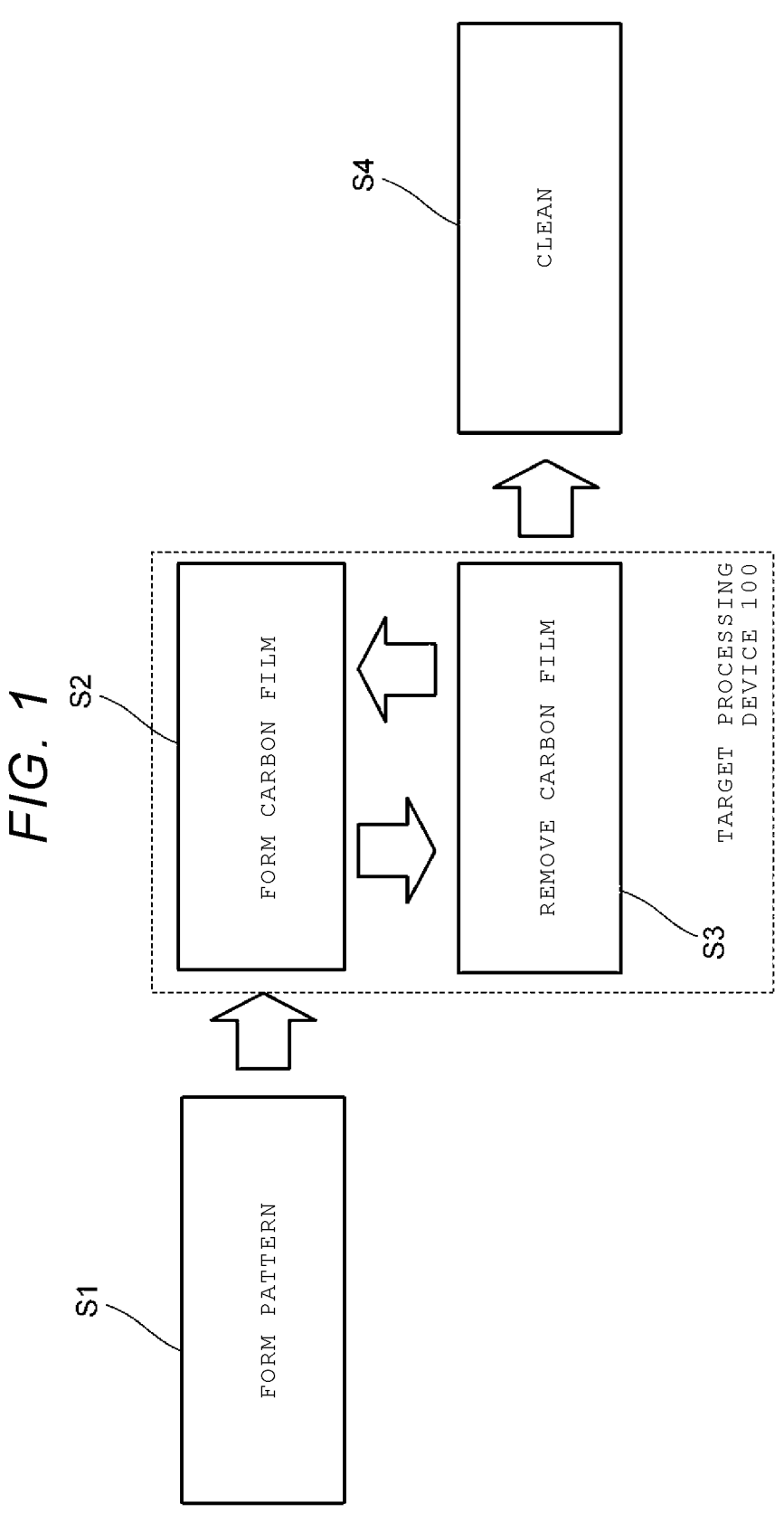
FIG. 1 is a schematic view illustrating an example of a target processing method.

Embodiments provide a technology for reducing roughness of a surface of a target.

In general, according to one embodiment, a target processing method includes: importing a target into a processing chamber; forming a film including carbon on the target using at least one of first ion including carbon and a first plasma including carbon; and removing the film by a reaction between a second plasma and the film. The forming of the film and the removing of the film are alternately performed a number of times in the processing chamber without removing the target from the processing chamber.

Hereinafter, embodiments will be described with reference to the drawings. Relationships between thicknesses of elements illustrated in the drawings and planar dimensions, rates of the thicknesses of the elements, and the like are sometimes different from those of actual elements. In the embodiments, the same reference numerals are given to substantially the same elements and description thereof will be omitted.

First Embodiment

In the present embodiment, examples of a target processing method and a target processing device will be described.

(Target Processing Method)

FIG. 1 is a schematic view illustrating an example of a target processing method. As illustrated in FIG. 1, the target processing method includes a pattern forming step S1, a carbon film forming step S2, a carbon film removing step S3, and a cleaning step S4.

In the pattern forming step S1, a pattern is formed on the surface of a target. The target is, for example, an original plate. The original plate includes a transparent substrate such as a quartz glass substrate and is, for example, a template used in a pattern forming method using a nanoimprint lithography (NIL) or a photomask used in optical lithography. In the photomask, a pattern is formed by a light-shielding film, a halftone film, or the like including a metal such as chrome on a transparent substrate such as a quartz glass. As a general template, for example, a master template serving as a mold or a replica template manufactured using the master template is used. It is noted that the target is not limited to the original plate such as a template. The target may be, for example, a semiconductor substrate in which a circuit pattern is formed on a semiconductor wafer such as a silicon wafer. Hereinafter, an example in which a replica template is used for a target will be described. However, the embodiment is not limited thereto.

In a pattern forming method using an NIL, a template is pressed on an imprinted material layer such as an ultraviolet curing resin provided on the target, light is radiated to cure the imprinted material layer and transfer the pattern to the imprinted material layer.

Figures 2, 3:
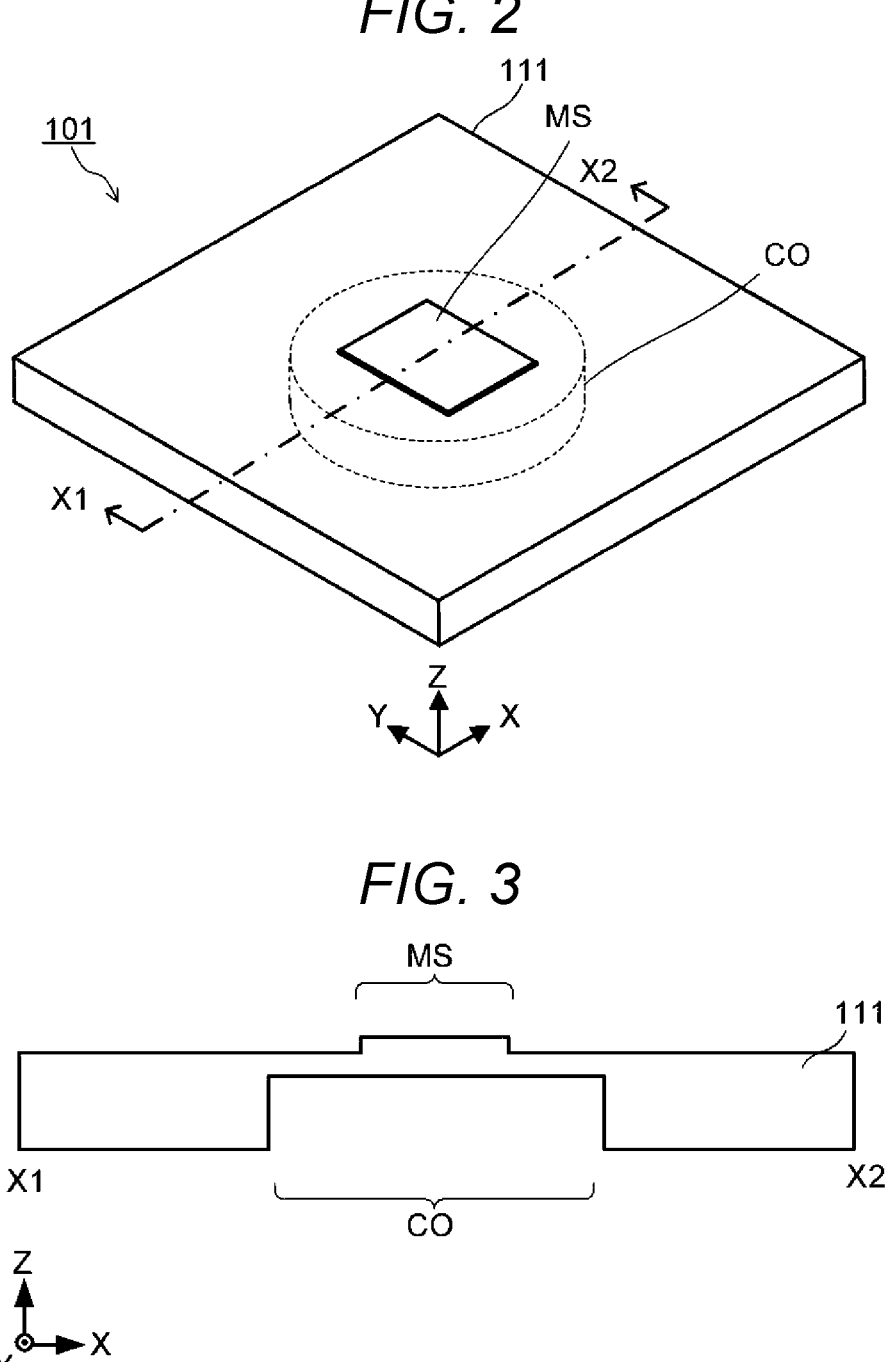
FIG. 2 is a perspective schematic view illustrating a structure example of a template.
FIG. 3 is a cross-sectional schematic view illustrating the structure example of the template.

FIG. 2 is a perspective schematic view illustrating a structure example of a template. As illustrated in FIG. 2, the template includes a surface MS called a mesa and a base substrate 111 that has a groove CO. The base substrate 111 is, for example, a quartz glass substrate. Accordingly, the base substrate 111 includes silicon and oxygen. FIG. 3 is a cross-sectional schematic view illustrating the structure example of the template and illustrates a part of an X-Z cross-section including an X axis of the base substrate 111 and a Z axis orthogonal to the X and Y axes along a line segment X1-X2 illustrated in FIG. 2.

Figures 4, 5:
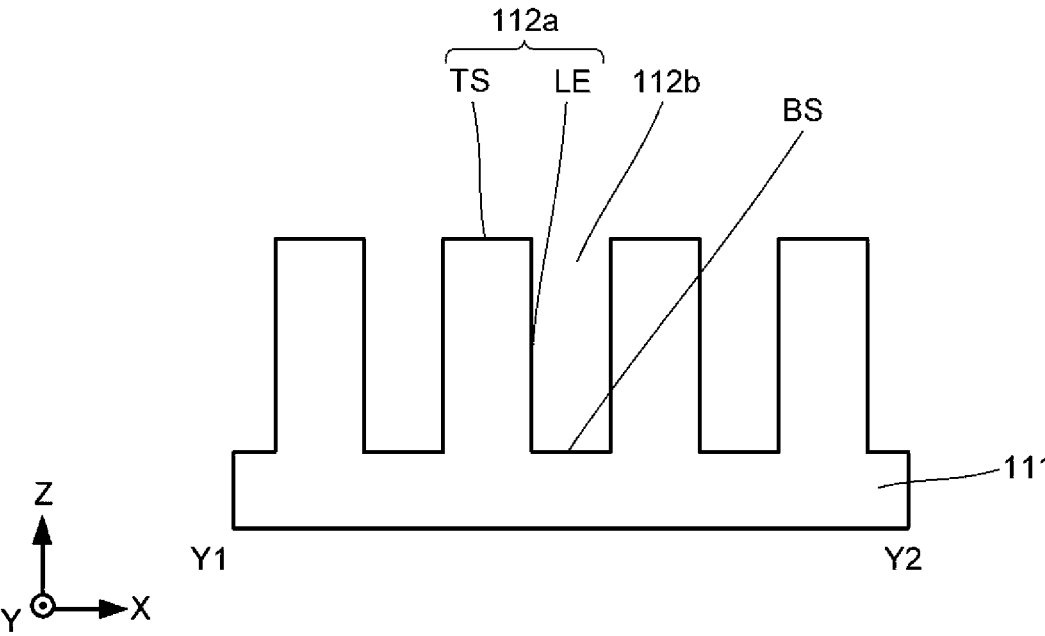
FIG. 4 is a top schematic view illustrating a layout example of a surface.
FIG. 5 is a cross-sectional schematic view illustrating a layout example of the surface.

FIG. 4 is a top schematic view illustrating a layout example of the surface MS and illustrates a part of an X-Y plane of the base substrate 111. FIG. 5 is a cross-sectional schematic view illustrating a layout example of the surface MS and illustrates a part of an X-Z cross-section of the base substrate 111 along a line segment Y1-Y2 illustrated in FIG. 4.

The surface MS includes an imprint pattern 112. The imprint pattern 112 is a pattern which is to be transferred in accordance with a pattern forming method using the NIL. The number, positions, and shapes of the imprint patterns 112 are not particularly limited. For example, FIGS. 4 and 5 illustrate the imprint pattern 112 formed by a protrusion portion 112a having an upper surface TS and a line-and-space including a recessed portion 112b having a lower surface BS. The imprint pattern 112 further includes a lateral surface (also referred to as a line edge) LE of the protrusion portion 112a between the upper surface TS and the lower surface BS.

By alternately repeating the carbon film forming step S2 and the carbon film removing step S3 in a processing chamber I of the target processing device 100 without removal of the target from the processing chamber I as will be described below, it is possible to reduce roughness of the surface of the target, and thus improve quality of the pattern. The carbon film forming step S2 and the carbon film removing step S3 are performed without exposing the target to the air by using one target processing device 100.

Figure 6:
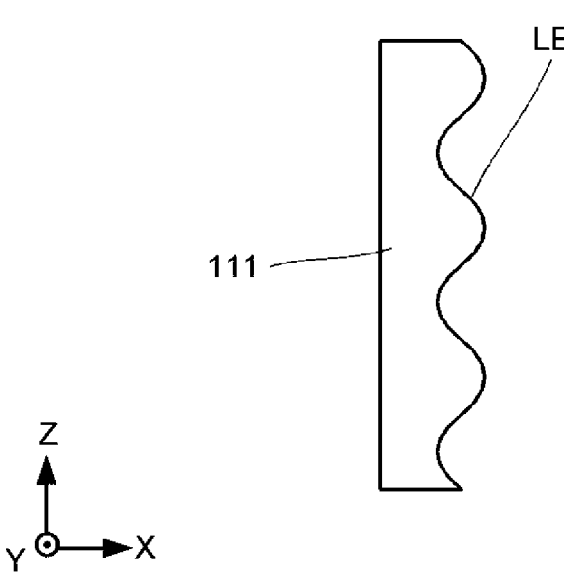
FIG. 6 is a schematic view illustrating a lateral surface of a target prior to performing a carbon film forming step and a carbon film removing step.
Figure 7:
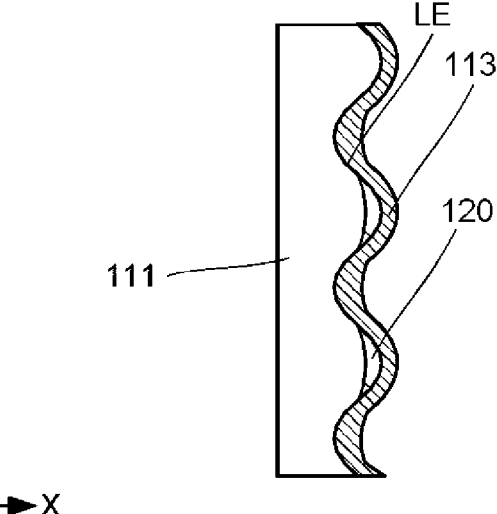
FIG. 7 is a schematic view illustrating the lateral surface of the target after performing the carbon film forming step and before performing the carbon film removing step.
Figure 8:
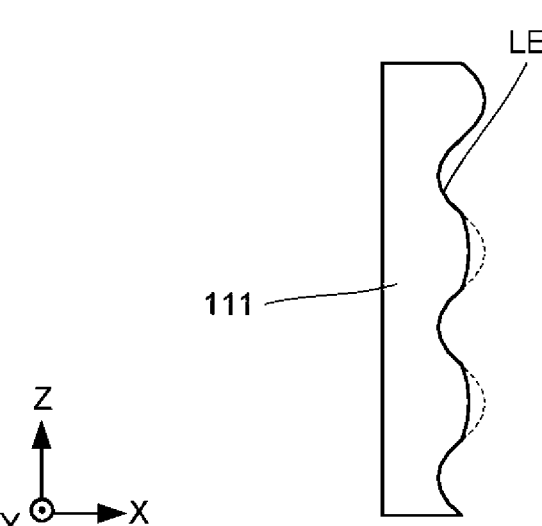
FIG. 8 is a schematic view illustrating the lateral surface of the target after performing the carbon film forming step and the carbon film removing step.

FIGS. 6, 7, and 8 are schematic views illustrating a change in the target caused by performing the carbon film forming step S2 and the carbon film removing step S3.

FIG. 6 illustrates an example of the lateral surface LE of the template before the carbon film forming step S2 and the carbon film removing step S3 are performed. The lateral surface LE may be an uneven surface, as illustrated in FIG. 6.

Subsequently, in the carbon film forming step S2, as illustrated in FIG. 7, a film 113 is formed on the surface of the base substrate 111. The film 113 is thickly formed because of the recessed portions on the surface of the base substrate 111, as illustrated in FIG. 7. The film 113 includes, for example, carbon (C). The film 113 may include a compound such as silicon carbide. The film 113 may be an amorphous carbon film such as a diamond-like carbon (DLC) film. The film 113 is formed, for example, by implanting and depositing ions such as carbon ions on the surface of the base substrate 111.

The film 113 is also formed on the lateral surface LE. By forming the film 113, the base substrate 111 is partially altered on the lateral surface LE so that a mixed layer 120 is formed. The mixed layer 120 is formed, for example, by implanting carbon ions into the base substrate 111. When the carbon ions are implanted into the base substrate 111, Si—O bonding in silicon dioxide of quartz glass is cut and silicon and carbon are bonded to form Si—C bonding. Alternatively, carbon is further bonded with oxygen to form Si—O—C bonding. Accordingly, the mixed layer 120 includes carbon, silicon, and oxygen.

Subsequently, in the carbon film removing step S3, the film 113 is removed, as illustrated in FIG. 8. The film 113 can be removed using, for example, a plasma generated from a gas including at least one of oxygen, nitrogen, and a rare gas.

In the carbon film removing step S3, at least a part of the mixed layer 120 is also removed. Thus, it is possible to reduce roughness of the lateral surface LE. The carbon film forming step S2 and the carbon film removing step S3 are repeatedly performed, for example, until the roughness of the surface of the base substrate 111 reaches a desired value.

(Target Processing Device)

Figure 9:
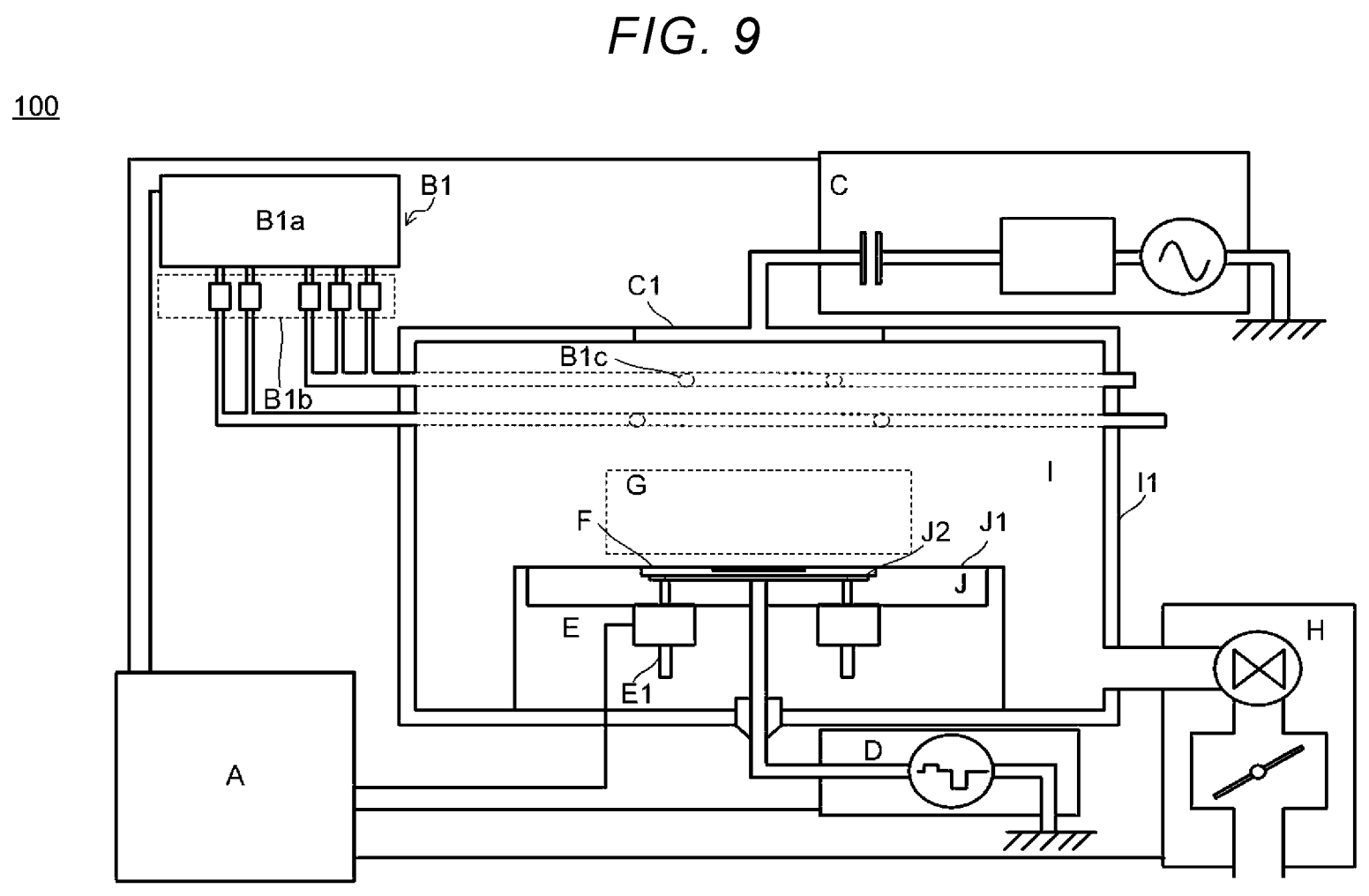

Next, a configuration example of the target processing device 100 will be described. FIG. 9 is a schematic view illustrating a configuration example of the target processing device 100. The target processing device 100 includes a control device A, a gas supply source B1, an alternating-current power source C, a direct-current power source D, an elevator E, a conveyance port G, a vacuum discharge mechanism H, a processing chamber I, and a stage J.

The control device A controls an operation of each element in the target processing device 100. The control device A can control at least one of an operation of supplying a gas from the gas supply source B1, an operation of supplying an alternating-current voltage from the alternating-current power source C to the processing chamber I, an operation of supplying a direct-current voltage from the direct-current power source D to the processing chamber I, an operation of elevating the target F by the elevator E, an operation of conveying the target F between the processing chamber I and the outside via the conveyance port G, and a discharging operation of the processing chamber I by the vacuum discharge mechanism H.

The control device A may include hardware including, for example, a processor, a personal computer, or the like. The hardware is directly connected to each of the control device A, the gas supply source B1, the alternating-current power source C, the direct-current power source D, the elevator E, the conveyance port G, and the vacuum discharge mechanism H or indirectly connected thereto via a computer network, and thus can control each operation by transmitting and receiving information thereto and therefrom. It is noted that each operation may be stored as an operation program in a computer-readable recording medium such as a memory and each operation may be performed by appropriately reading the operation program stored in the recording medium by hardware.

The gas supply source B1 can supply a film forming gas and an etching gas to the processing chamber I, respectively. The film forming gas includes, for example, a carbon compound such as methane (CH4), acetylene (C2H2), or toluene (C6H5CH3). The etching gas includes, for example, oxygen and fluorine. Examples of the etching gas including fluorine include fluorocarbons such as tetrafluoromethane (CF4) and trifluoromethane (CHF3). The gas supply source B1 may further supply a purge gas to the processing chamber I. The purge gas includes, for example, nitrogen.

The gas supply source B1 is connected to the processing chamber I and the control device A. The gas supply source B1 includes a cylinder cabinet B1a, a mass flow controller B1b, and a gas port B1c. The pluralities of cylinder cabinets B1a, mass flow controllers B1b, and gas ports B1c corresponding to the number of gases to be supplied. For example, when the gas supply source B1 supplies the film forming gas, the etching gas, and the purge gas, three or more cylinder cabinets B1a, three or more mass flow controllers B1b, and three or more gas ports B1c are provided, respectively.

The alternating-current power source C is connected to the processing chamber I and the control device A. The alternating-current power source C can supply an alternating-current voltage to the processing chamber I using an electrode C1 provided in the processing chamber I. The alternating-current voltage has a frequency equal to or greater than, for example, 13.56 MHz. The alternating-current power source C serves as a plasma/ion supply source along with the gas supply source B1.

The direct-current power source D is connected to the processing chamber I and the control device A. The direct-current power source D can supply a direct-current voltage to the processing chamber I using an electrode J2 embedded in a stage J. The direct-current power source D serves as a plasma/ion supply source along with the gas supply source B1.

The elevator E can elevate the target F using the lift E1. The elevator E is connected to the control device A. The control device A controls elevation of the elevator E.

The conveyance port G is provided in a casing that forms the processing chamber I. The conveyance port G is opened or closed to connect or disconnect the processing chamber I to or from the outside. The control device A controls opening or closing of the conveyance port G.

The vacuum discharge mechanism H is connected to the processing chamber I. The vacuum discharge mechanism H can discharge a gas from the processing chamber I.

The processing chamber I is where processing such as carbon film forming or carbon film removing is performed on the target F. A pressure of the processing chamber I can be adjusted to a predetermined pressure by normally discharging the gas from the processing chamber I by the vacuum discharge mechanism H.

The stage J is provided in the processing chamber I. The stage J includes a surface J1 on which the target F is disposed.

Figure 10:
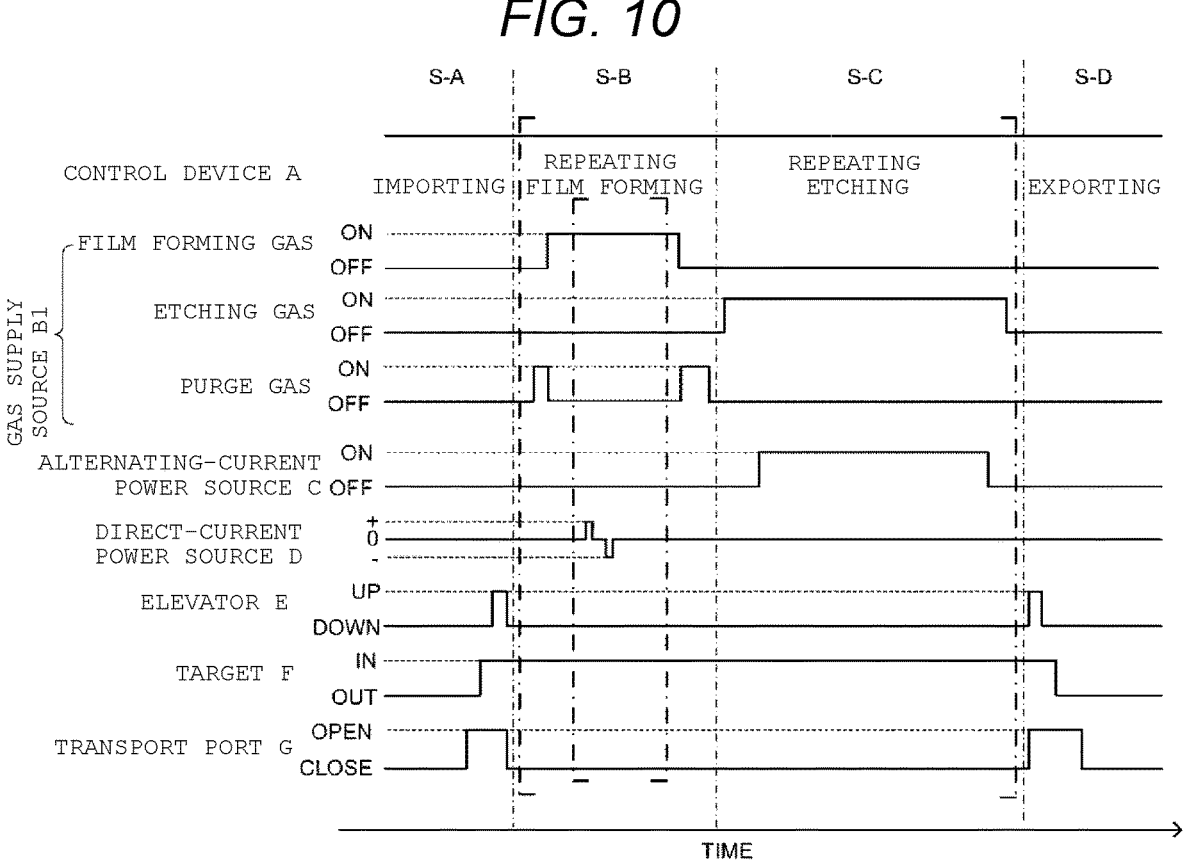
FIG. 10 is a timing chart illustrating an example of a target processing method.

Next, an example of a target processing method using the target processing device 100 will be described with reference to FIG. 10. FIG. 10 is a timing chart illustrating an example of a target processing method.

As illustrated in FIG. 10, the example of the target processing method includes an import step S-A, a film-forming step S-B, an etching step S-C, and an export step S-D.

In the import step S-A, the conveyance port G is opened (conveyance port G: OPEN), the target F is imported into the processing chamber I from a conveyance unit provided outside of the processing chamber I and the conveyance port G is closed (conveyance port G: CLOSE).

Figure 11:
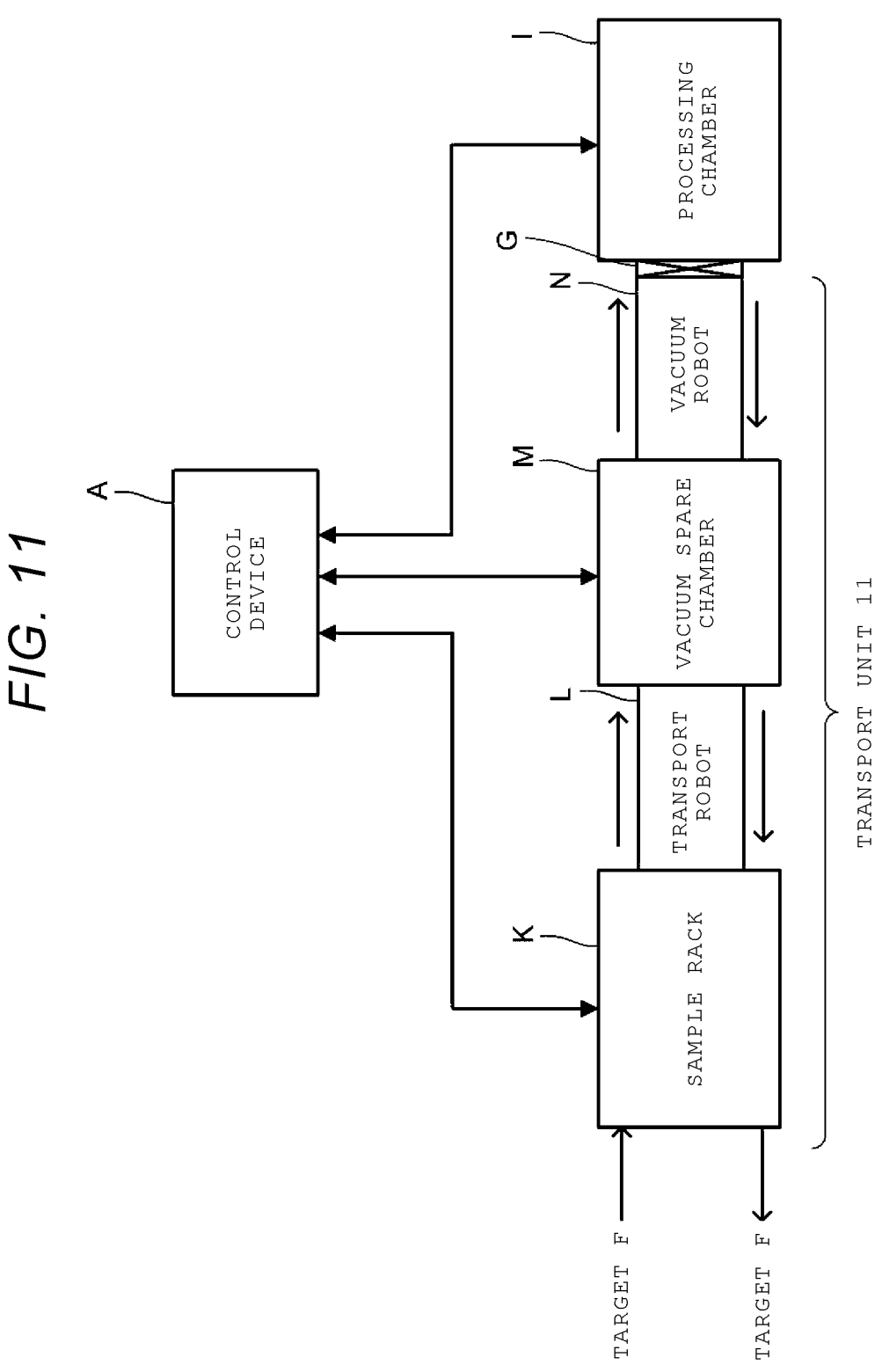
FIG. 11 is a schematic view illustrating a configuration example of a conveyance unit.

FIG. 11 is a schematic view illustrating a configuration example of a conveyance unit. The conveyance unit includes a sample rack K, a transport robot L, a vacuum spare chamber M, and a vacuum robot N.

To import the target F into the processing chamber I, the target F is set on the sample rack K. A processing recipe for the target F is set by the control device A. The processing recipe includes, for example, data indicating process conditions such as a type of supply gas, a flow rate of the supply gas, a pressure in the processing chamber, a voltage application condition, and a time duration of the film-forming step S-B and the etching step S-C. The data may be stored in, for example, a memory provided in the control device A.

When the control device A gives an instruction to start the steps, the target F is conveyed from the sample rack K to the vacuum spare chamber M by the transport robot L. The target F is imported from the vacuum spare chamber M into the processing chamber I via the conveyance port G by the vacuum robot N normally under a vacuum atmosphere (target F: IN).

The target F that has been imported into the processing chamber I is raised from a robot arm of the vacuum robot N by the elevator E illustrated in FIG. 9. Thereafter, the robot arm is returned to an original position, the conveyance port G is closed, and the target F is lowered and placed on the surface J1 of the stage J by the elevator E.

Subsequently, the film-forming step S-B and the etching step S-C are alternately repeated in the processing chamber I based on the processing recipe set by the control device A, without removal of the target F from the processing chamber I. The number of repetitions is appropriately set according to the processing recipe.

In the film-forming step S-B, an instruction of the purge gas from the gas supply source B1 to the processing chamber I is first started (purge gas: ON). Thus, the atmosphere in the processing chamber I is adjusted. Meanwhile, an introduction of the film forming gas and the etching gas is stopped (film forming gas and etching gas: OFF). Subsequently, the introduction of the purge gas into the processing chamber I is stopped (purge gas: OFF) and the introduction of the film forming gas into the processing chamber I is started (film forming gas: ON). Meanwhile, the introduction of the etching gas is stopped (etching gas: OFF).

While the film forming gas is introduced into the processing chamber I, supply of the direct-current voltage from the direct-current power source D is started. Thus, a first plasma such as a carbon plasma is generated from the film forming gas. A potential of the direct-current voltage is switched in order of a positive potential (direct-current power source D: +), a zero potential (direct-current power source D: 0), and a negative potential (direct-current power source D: −) over time. The first plasma is generated at the time of the positive potential and deposited on the surface of the target F, for example, at the time of the negative potential to form the film 113 illustrated in FIG. 7. It is noted that the switching of the positive potential, the zero potential (non-potential), and the negative potential is performed repeatedly. The number of repetitions is appropriately set according to, for example, a parameter such as a thickness of the film 113 to be formed. The potential of the direct-current voltage is changed with a frequency of 3 to 5 kHz in a range of ±5 kV. A supply time of the direct-current voltage per time is, for example, 60 seconds or less. A flow rate of the film forming gas is, for example, 10 sccm or more. A pressure of the processing chamber I is, for example, 0.4 Pa or less. In the film-forming step S-B, for example, the film 113 with a thin thickness equal to or less than 5 nm is formed in some cases. Therefore, to control a film forming speed, it is important to control the flow rate of the film forming gas or an application sequence of the direct-current voltage.

After the film 113 with a desired thickness is formed, the supply of the direct-current voltage is stopped and the supply of the film forming gas is stopped (film forming gas: OFF). Subsequently, an introduction of the purge gas from the gas supply source B1 to the processing chamber I is started (purge gas: ON). The atmosphere in the processing chamber I is adjusted with the purge gas. At this time, the supply of the film forming gas and the etching gas remains stopped (film forming gas and etching gas: OFF). Thereafter, the introduction of the purge gas from the gas supply source B1 is stopped (purge gas: OFF).

In the etching step S-C, the introduction of the film forming gas and the purge gas remains stopped (film forming gas and purge gas: OFF) and the introduction of the etching gas from the gas supply source B1 to the processing chamber I is started (etching gas: ON).

While the etching gas is introduced into the processing chamber I, supply of an alternating-current voltage from the alternating-current power source C is started (alternating-current power source C: ON). Thus, a second plasma such as an oxygen plasma is generated from the etching gas. As illustrated in FIG. 8, the mixed layer 120 and the film 113 on the surface of the target F are removed with the second plasma. A supply time of the alternating-current voltage per time is longer than the supply time of the direct-current voltage per time and is appropriately set according to, for example, a parameter such as the thickness of the film 113 to be removed. The supply time of the alternating-current voltage per time is, for example, 120 seconds or more. A flow rate of the etching gas is, for example, 30 sccm or more. A pressure of the processing chamber I is, for example, 2.7 Pa or less. After the film 113 is removed, the supply of the alternating-current voltage is stopped (alternating-current power source C: OFF) and the introduction of the etching gas is stopped (etching gas: OFF).

The second plasma is preferably an oxygen plasma. It is possible to remove the film 113 and the mixed layer 120 while inhibiting the removal of the base substrate 111 by the oxygen plasma.

The film-forming step S-B and the etching step S-C are alternately performed in the processing chamber I without removal of the target F from the processing chamber I. The switching between the film-forming step S-B and the etching step S-C is thus repeated. The number of repetitions is appropriately set according to, for example, a parameter of the roughness of the surface of the target F.

In the export step S-D, the conveyance port G is opened (conveyance port G: OPEN), the target F is exported from the conveyance port G by the vacuum robot N in the conveyance unit illustrated in FIG. 11 (target F: OUT), and the conveyance port G is closed (conveyance port G: CLOSE). The target F is returned to the sample rack K by the transport robot L through the vacuum spare chamber M and is exported outside of the target processing device 100.

By performing the film-forming step S-B and the etching step S-C, it is possible to reduce the roughness of the surface of the target F. For example, when the film-forming step S-B and the etching step S-C are each performed once, the roughness of the surface of the target F can be reduced, for example, up to 85% of an initial state. When the film-forming step S-B and the etching step S-C are repeated three or more times, the roughness of the surface of the target F can be reduced, for example, up to 74% of the initial state. A change in pattern dimensions at this time can be reduced to 1 nm or less.

Thereafter, in the cleaning step S4, the surface of the target F is cleaned. The target processing method has been described above.

As described above, in the target processing method according to the first embodiment, the carbon film generating and the carbon film removing can be alternately performed in the processing chamber I without removal of the target F from the processing chamber I and using one target processing device 100. Thus, it is possible to process the target F without exposing the target F to the air and it is possible to inhibit a change in a formation amount and a removal amount of the film 113 in accordance with oxidization and humidity absorption on the surface of the target F. Accordingly, it is possible to reduce the roughness of the surface of the target without considerably changing processing dimensions.

Second Embodiment

Figure 12A:
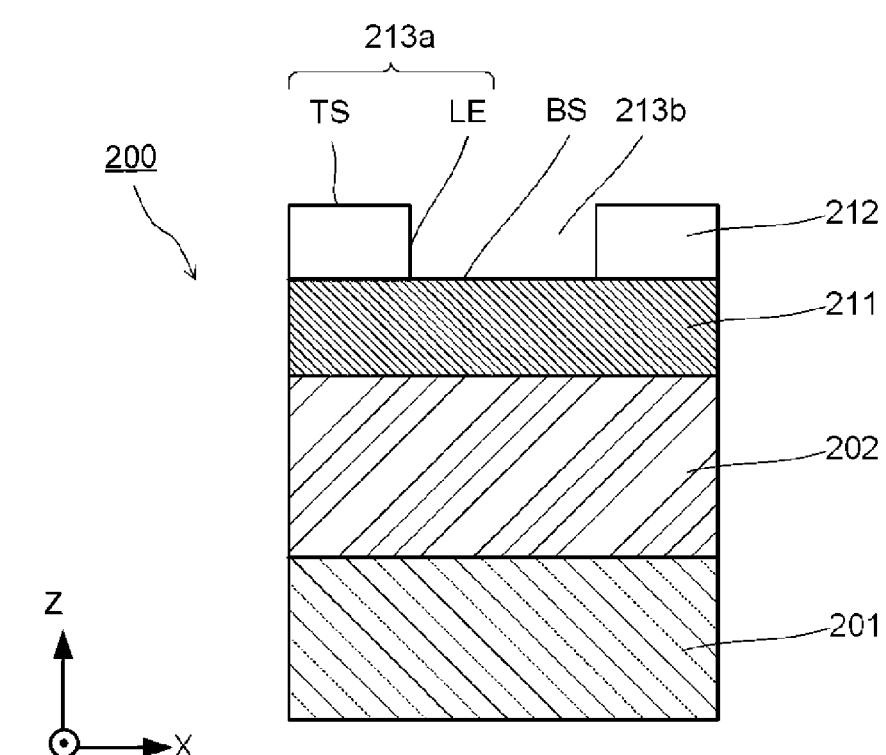
FIG. 12A is a cross-sectional schematic view illustrating an example of a method of processing another example of a target.
Figure 12B:
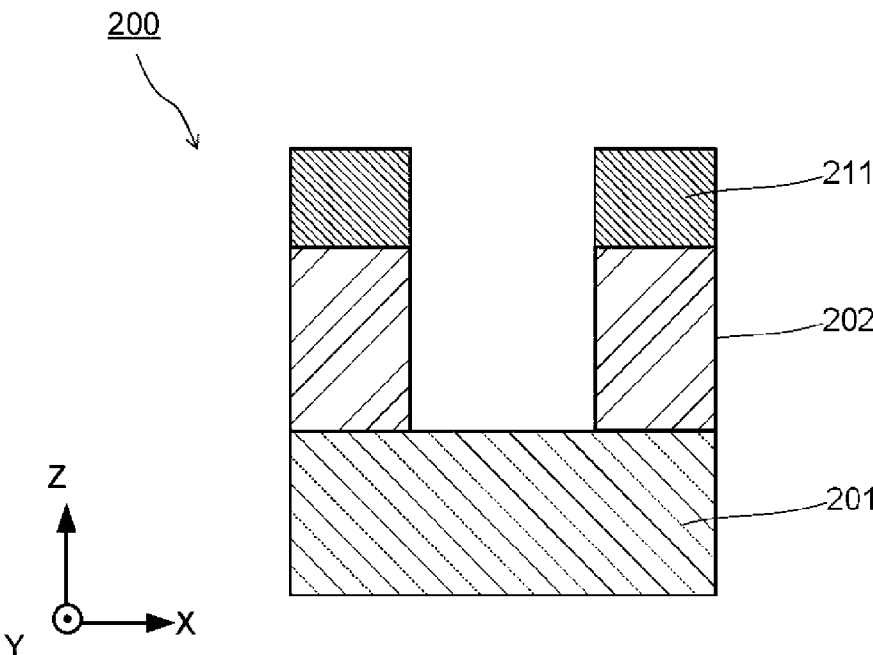
FIG. 12B is a cross-sectional schematic view illustrating an example of a method of processing still another example of the target.

A target which can be processed using the target processing device 100 is not limited to a template. FIGS. 12A and 12B are cross-sectional schematic views illustrating an example of a method of processing another example of a target.

FIG. 12A illustrates a part of the target 200 imported into the processing chamber I. The target 200 is, for example, a photomask and includes a substrate 201, a phase shift film 202, a metal film 211, and an oxide film 212, as illustrated in FIG. 12A.

The substrate 201 is formed of, for example, quartz glass and includes silicon and oxygen.

The phase shift film 202 is, for example, a silicon nitride film and includes silicon and nitrogen. The phase shift film 202 is provided on the substrate 201. The phase shift film 202 is a film that has transmittance of exposure light lower than quartz glass in which the substrate 201 is formed and has a property for reversing a phase of transmitted light. The photomask including the phase shift film 202 is referred to as a phase shift mask.

The metal film 211 is provided on the phase shift film 202. The metal film 211 contains, for example, chrome. The metal film 211 processes the phase shift film 202 by etching.

The oxide film 212 is provided on the metal film 211. The oxide film 212 is, for example, a silicon oxide film and includes silicon and oxygen. The oxide film 212 processes the metal film 211 by etching.

The oxide film 212 of the target 200 illustrated in FIGS. 12A and 12B has a pattern including a protrusion portion 213*a* that has an upper surface TS and a recessed portion 213*b* in which the upper surface of the metal film 211 is exposed as a lower surface BS. The oxide film 212 further has a lateral surface LE of the protrusion portion 213*a* between the upper surface TS and the lower surface BS.

The target 200 illustrated in FIG. 12A is formed in the following order, for example. First, the phase shift film 202 is formed on the substrate 201, the metal film 211 is formed on the phase shift film 202, the oxide film 212 is formed on the metal film 211, and a resist is formed on the oxide film 212. Subsequently, the pattern is processed by developing the pattern in the resist and partially etching the oxide film 212 using the resist in which the pattern is developed as a processing mask. At this time, roughness of the resist may be transferred to the oxide film 212. Thereafter, the target 200 is formed by removing the resist remaining on the oxide film 212.

As in the first embodiment, in the target 200 illustrated in FIG. 12A, roughness or unevenness or the like on the surface of the lateral surface LE can be reduced by alternately repeating the carbon film forming step S2 and the carbon film removing step S3 in the processing chamber I without removal of the target 200 from the processing chamber I and using the target processing device 100. Since other descriptions of the carbon film forming step S2 and the carbon film removing step S3 are the same as the description of the carbon film forming step S2 and the carbon film removing step S3 in the first embodiment, the description of the first embodiment can be adopted.

After processes similar to those of the foregoing first embodiment are performed, as illustrated in FIG. 12B, the pattern is transferred to the phase shift film 202 by processing the metal film 211 by etching using the oxide film 212 with the reduced roughness as a mask and further processing the phase shift film 202 using the metal film 211 as a mask. Thereafter, the photomask is manufactured by removing the metal film 211.

The second embodiment may be appropriately combined with other embodiments.

Third Embodiment

Figure 13:
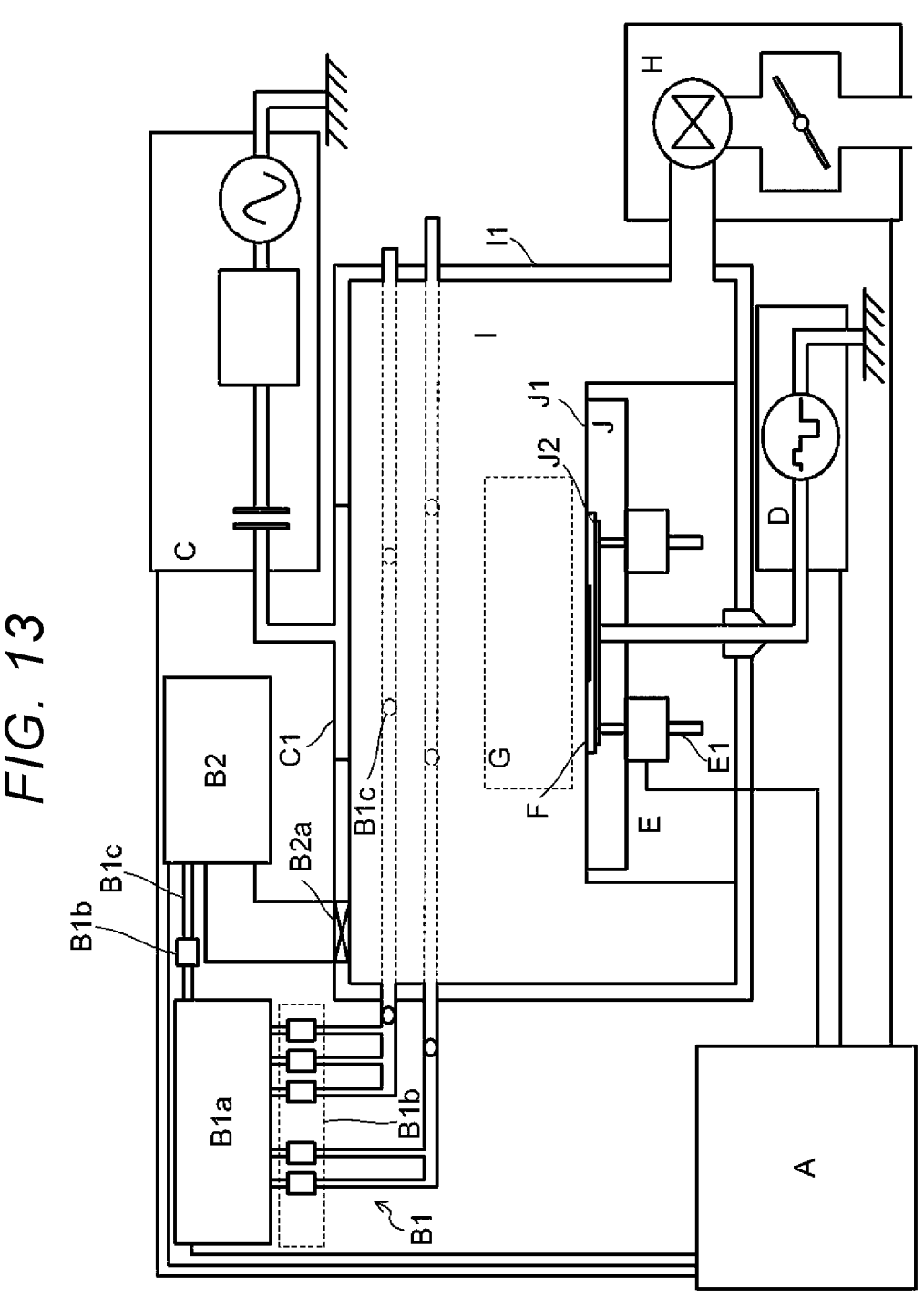
FIG. 13 is a schematic view illustrating another configuration example of a target processing device.

A configuration of the target processing device 100 is not limited to the configuration illustrated in FIG. 9. FIG. 13 is a schematic view illustrating another configuration example of the target processing device 100. The target processing device 100 illustrated in FIG. 13 includes a control device A, a gas supply source B1, an alternating-current power source C, a direct-current power source D, an elevator E, a conveyance port G, a vacuum discharge mechanism H, a processing chamber I, and a stage J, as in the target processing device 100 illustrated in FIG. 9. Hereinafter, differences from the target processing device 100 illustrated in FIG. 9 will be described and the description of the first embodiment will be adopted for other portions.

The target processing device 100 illustrated in FIG. 13 further includes a remote plasma source B2. The remote plasma source B2 is connected to the gas supply source B1, and can generate a remote plasma such as an oxygen plasma from an etching gas supplied from a cylinder cabinet B1a via the mass flow controller B1b and the gas port B1c and supply the remote plasma to the processing chamber I by opening a supply gate B2a. The supply gate B2a may be a valve. The remote plasma source B2 is connected to the control device A. The control device A controls a plasma supply operation from the remote plasma source B2. The remote plasma source B2 serves as a plasma or ion supply source along with the gas supply source B1.

As in the first embodiment, the roughness of the surface of the lateral surface LE can be reduced by alternately repeating the carbon film forming step S2 and the carbon film removing step S3 using the target processing device 100 illustrated in FIG. 13. In the carbon film removing step S3, the film 113 can be removed using the remote plasma such as an oxygen plasma generated by the remote plasma source B2.

Figure 14:
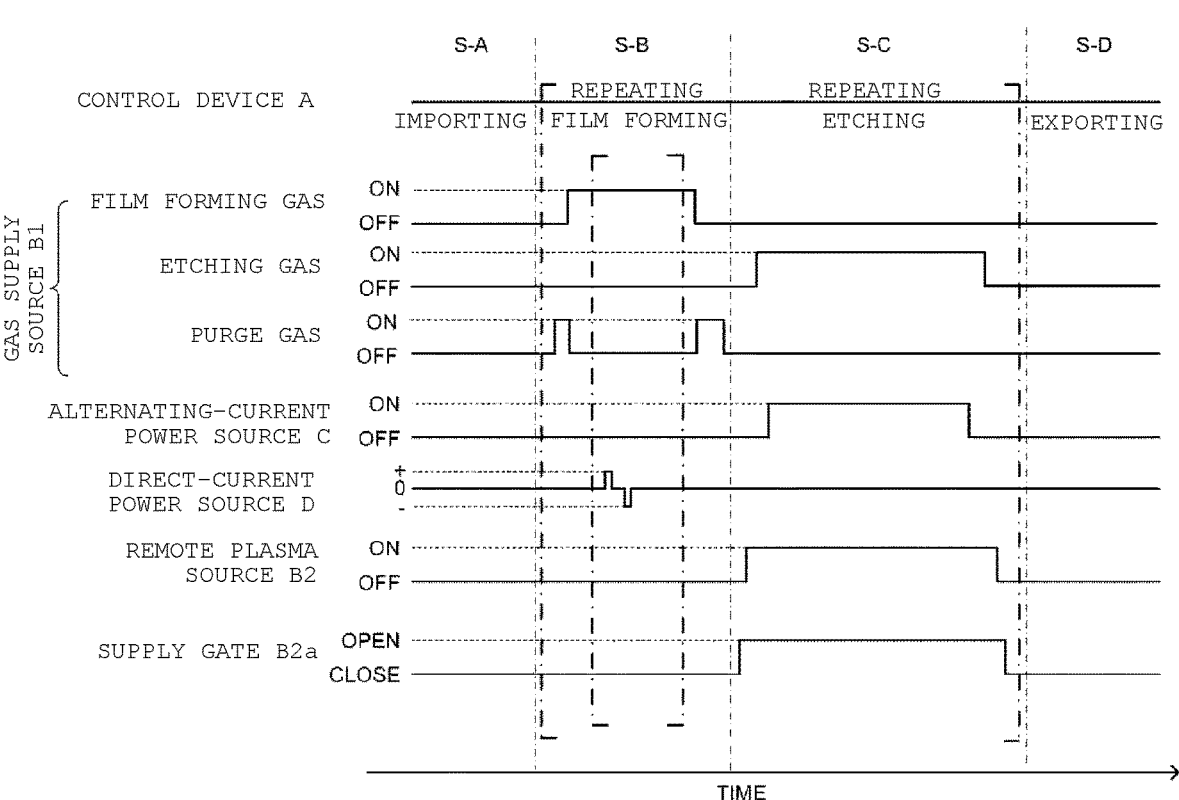
FIG. 14 is a timing chart illustrating an example of a target processing method.

FIG. 14 is a timing chart illustrating an example of a target processing method. Hereinafter, differences from the first embodiment will be described and the description of the first embodiment will be adopted for other portions. To facilitate description, a timing chart of the elevator E, the target F, and the conveyance port G is omitted in FIG. 14, but operations similar to those of the first embodiment are assumed to be performed.

In the film-forming step S-B, the supply gate B2a is closed (supply gate B2a: CLOSE), and an operation of the remote plasma source B2 is stopped (remote plasma source B2: OFF).

In the etching step S-C, an introduction of a film forming gas and a purge gas remains stopped (film forming gas and purge gas: OFF) and the supply gate B2a is opened (supply gate B2a: OPEN). Thereafter, an operation of the remote plasma source B2 is started (remote plasma source B2: ON). Further, an instruction of the etching gas from the gas supply source B1 into the processing chamber I is started (etching gas: ON), and supply of an alternating-current voltage is started (alternating-current power source C: ON). Thus, a second plasma is generated from the etching gas and the remote plasma is supplied from the remote plasma source B2 to the processing chamber I. The mixed layer 120 and the film 113 of the surface of the target F are removed by the second plasma and the remote plasma. After the film 113 and the mixed layer 120 are removed, the supply of the alternating-current voltage is stopped (alternating-current power source C: OFF) and the introduction of the etching gas is stopped (etching gas: OFF). Thereafter, the operation of the remote plasma source B2 is stopped (remote plasma source B2: OFF) and the supply gate B2a is closed (supply gate B2a: CLOSE). In this way, by setting a supply time of the remote plasma to be longer than a supply time of the second plasma, it is possible to preferably remove the film 113 and clean the processing chamber I.

It is noted that the film 113 may be removed using only the remote plasma generated by the remote plasma source B2 without providing the alternating-current power source C. Since the other description of the carbon film forming step S2 and the carbon film removing step S3 are the same as the description of the carbon film forming step S2 and the carbon film removing step S3 of the first embodiment, the description of the first embodiment can be adopted.

The third embodiment may be appropriately combined with other embodiments.

Fourth Embodiment

Figure 15:
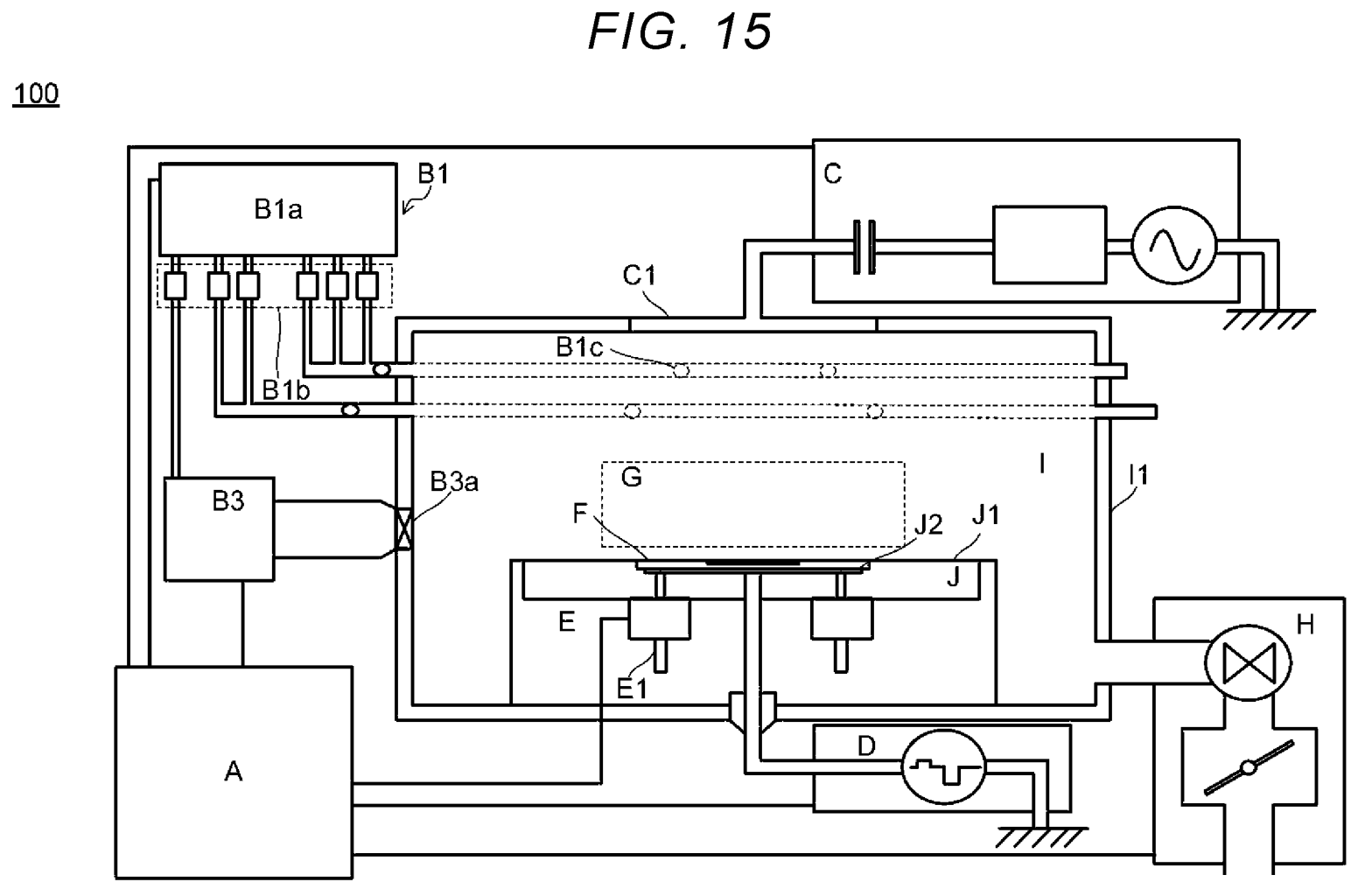

A configuration of the target processing device 100 is not limited to the configuration illustrated in FIG. 9. FIG. 15 is a schematic view illustrating still another configuration example of a target processing device 100. The target processing device 100 illustrated in FIG. 15 includes a control device A, a gas supply source B1, an alternating-current power source C, a direct-current power source D, an elevator E, a conveyance port G, a vacuum discharge mechanism H, a processing chamber I, and a stage J, as in the target processing device 100 illustrated in FIG. 9. Hereinafter, differences from the target processing device 100 illustrated in FIG. 9 will be described and the description of the first embodiment will be adopted for other portions.

The target processing device 100 illustrated in FIG. 14 further includes an arc ion source B3. The arc ion source B3 can generate a carbon ion from a solid carbon source such as a carbon rod by causing arc discharge and supply the carbon ion to the processing chamber I. The arc ion source B3 may be connected to the gas supply source B1 and a carrier gas may be introduced from the cylinder cabinet B1a by the mass flow controller B1b. The carrier gas is, for example, a rare gas or the like. By opening the supply gate B3a, it is possible to introduce the carbon ion into the processing chamber I from the arc ion source B3. The supply gate B3a may be a valve. The arc ion source B3 is electrically connected to the control device A. The control device A controls an ion supply operation of the arc ion source B3.

As in the first embodiment, the roughness of the surface of the lateral surface LE can be reduced by alternately repeating the carbon film forming step S2 and the carbon film removing step S3 using the target processing device 100 illustrated in FIG. 15. In the carbon film forming step S2, the film 113 can be formed using the carbon ion generated by the arc ion source B3.

Figure 16:
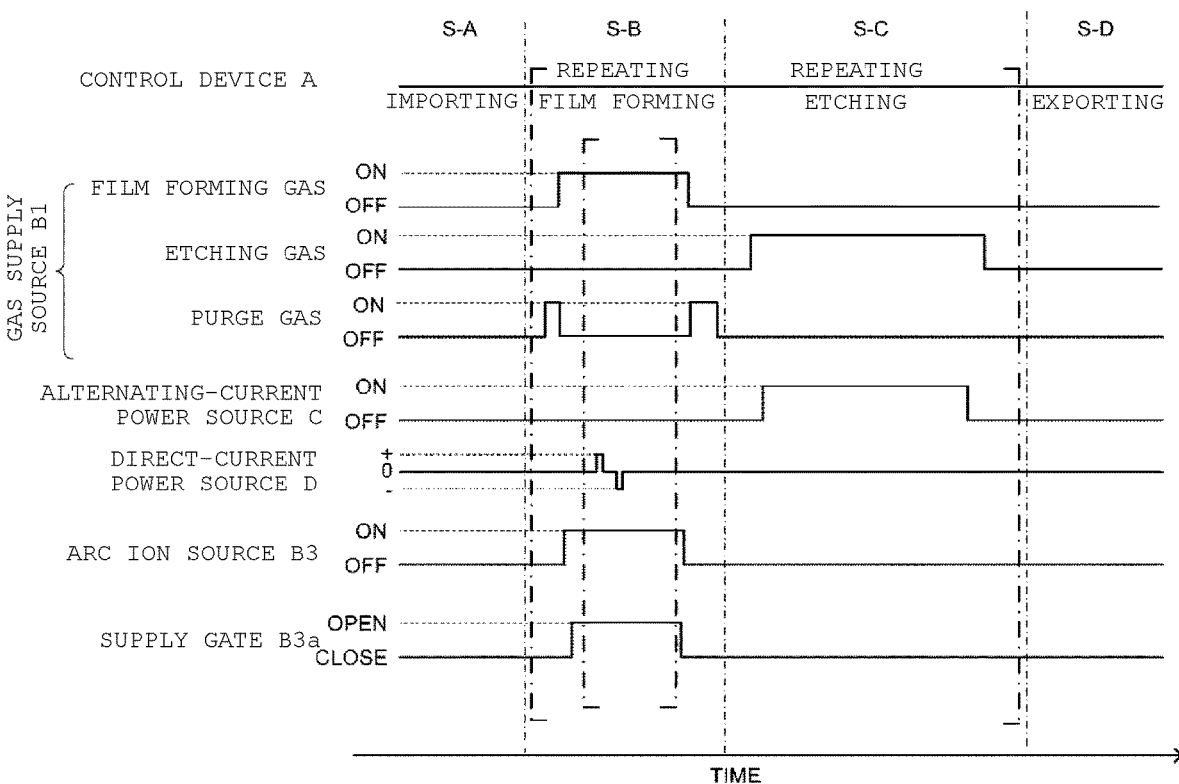
FIG. 16 is a timing chart illustrating an example of a target processing method.

FIG. 16 is a timing chart illustrating an example of a target processing method. Hereinafter, differences from the first embodiment will be described and the description of the first embodiment will be adopted for other portions. To facilitate the description, a timing chart of the elevator E, the target F, and the conveyance port G is omitted in FIG. 16, but operations similar to those of the first embodiment are assumed to be performed.

In the film-forming step S-B, an introduction of the purge gas from the gas supply source B1 to the processing chamber I is started (purge gas: ON). Thus, an atmosphere in the processing chamber I is adjusted. Meanwhile, an introduction of the film forming gas and the etching gas is stopped (film forming gas and etching gas: OFF). The supply gate B3a is closed (supply gate B3a: CLOSE). Subsequently, the introduction of the purge gas into the processing chamber I is stopped (purge gas: OFF), and an instruction of the film forming gas into the processing chamber I is started (film forming gas: ON). Meanwhile, the introduction of the etching gas is stopped (etching gas: OFF).

While the film forming gas is introduced into the processing chamber I, supply of a direct-current voltage from the direct-current power source D is started. Thus, the first plasma is generated from the film forming gas. The first plasma is generated at a positive potential and is accumulated on the surface of the target F at a negative potential to form the film 113 illustrated in FIG. 7. It is noted that the switching of the positive potential, the zero potential (nonpotential), and the negative potential is repeatedly performed.

While the film forming gas is introduced into the processing chamber I, an operation of the arc ion source B3 is started (arc ion source B3: ON) and the supply gate B3a is opened (supply gate B3a: OPEN). Thus, the carbon ion generated by the arc ion source B3 is supplied to the processing chamber I. The carbon ion is accumulated on the surface of the target F along with the first plasma to form the film 113. After the film 113 is formed, the supply gate B3a is closed (supply gate B3a: CLOSE). Thereafter, the supply of the film forming gas is stopped (film forming gas: OFF). By stopping the supply of the film forming gas after the supply gate B3a is closed, it is possible to inhibit reverse flow of the carbon ion to the gas supply source B1.

In the etching step S-C, the supply gate B3a is closed (supply gate B3a: CLOSE) and the operation of the arc ion source B3 is stopped (arc ion source B3: OFF). It is noted that the arc ion source B3 may remain operating.

It is noted that, in the carbon film forming step S2, the film 113 may be formed using only the carbon ion generated by the arc ion source B3 without providing the direct-current power source D. Since the arc ion source B3 can supply even a minute amount of ion, an accumulation amount of ion can be adjusted finely. Since other descriptions of the carbon film forming step S2 and the carbon film removing step S3 are the same as the description of the carbon film forming step S2 and the carbon film removing step S3 of the first embodiment, the description of the first embodiment can be adopted.

The fourth embodiment may be appropriately combined with other embodiments. For example, the target processing device 100 illustrated in FIG. 9 may include both the remote plasma source B2 in the third embodiment and the arc ion source B3 in the fourth embodiment.

Fifth Embodiment

In the target processing method using the target processing device 100 illustrated in FIG. 9, cleaning of the surface of the target F may be performed before the carbon film forming step S2 and the carbon film removing step S3. The cleaning is performed by exposing the surface of the target F to a plasma generated from oxygen, nitrogen, or a rare gas such as helium (He) or argon (Ar). The plasma used for the cleaning can be generated from a gas supplied from the cylinder cabinet B1a via the mass flow controller B1b and the gas port B1c, for example, by supplying an alternating-current voltage by the alternating-current power source C.

The cleaning may be performed at least before the first carbon film forming step S2, and may or may not be performed before the second or subsequent carbon film forming step S2.

The fifth embodiment may be appropriately combined with other embodiments.

Sixth Embodiment

In the target processing method using the target processing device 100 illustrated in FIG. 9, the target processing may be set using a processing recipe so that a thickness of the film 113 formed in the carbon film forming step S2 is measured and a time duration of the etching step S-C in the carbon film removing step S3 is determined according to the measured thickness.

As a method of measuring the thickness of the film 113, a method capable of measuring the thickness of the film without opening the processing chamber I to the atmosphere is preferable. For example, there is a method of calculating the thickness of the film by forming a viewport provided in a casing Il of the processing chamber I, causing light to be incident on the surface of the target F through the viewport, and measuring transmittance of the light. When the transmittance of the light of the target F is high, the thickness of the film 113 can be measured using interference of the light. A time duration of an etching condition sufficient for removing the film 113 with the calculated thickness is determined by $(T/S)(1+Over/100)$ [s] when the thickness of the film 113 is expressed with T [mm], a removing rate of the film 113 is expressed with S [nm/s], and an over-etching rate is expressed with Over [%].

The sixth embodiment may be appropriately combined with other embodiments.

Seventh Embodiment

In the target processing method using the target processing device 100 illustrated in FIG. 9, the carbon film forming step S2 may be performed using a magnetic body.

Figure 17:
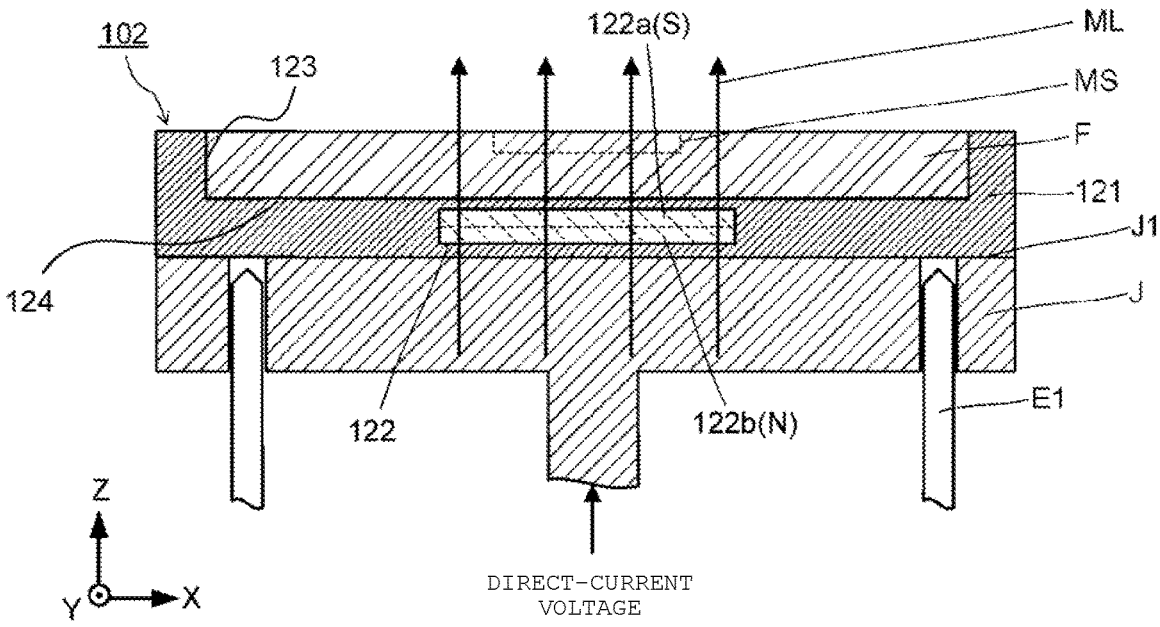
FIG. 17 is a schematic view illustrating an example of the carbon film forming step in which a magnetic body is used.

FIG. 17 is a schematic view illustrating an example of the carbon film forming step S2 in which a magnetic body is used. FIG. 17 illustrates a structure 102 that includes a tray 121 and a magnetic body 122. The structure 102 is imported or exported using a transport unit along with the target F.

The tray 121 can accommodate the target F. The tray 121 can be formed using, for example, a resin material such as plastic. The tray 121 is preferably a dielectric. As the dielectric, a resin such as polyetheretherketone (PEEK) may be used. The tray 121 is preferably formed of a material that has high heat tolerance, abrasion resistance, and excellent dimensional stability.

The magnetic body 122 is embedded in the tray 121 to be located under the target F and overlaps an accommodation unit of the target F in the Z axis direction. The magnetic body 122 has an S-pole region 122a facing the target F and an N-pole region 122b opposite to the target F. The magnetic body 122 has unipolarity in a direction parallel to a bottom surface 124 of a recessed portion 123. The magnetic body 122 is provided on the tray 121 and may be detachably mounted on the tray 121. The magnetic body 122 is, for example, ferromagnetic body. Examples of the ferromagnetic body include ferromagnetic bodies such as permanent magnets in which materials such as ferrite, a samarium-cobalt alloy, neodymium, and an iron-aluminum-silicon-based alloy are used. The magnetic body 122 may be embedded in an electrode J2.

In the carbon film forming step S2, as described above, a direct-current voltage is supplied and a plasma is generated from a film forming gas. At this time, magnetic force lines ML are formed from the S-pole region 122a to the N-pole region 122b in a direction in which the magnetic body 122 intersects the target F.

When the plasma is generated, a temperature of the electrode J2 is preferably adjusted so that the magnetic body 122 is less than a Curie temperature by, for example, a temperature control mechanism. A permanent magnet containing a rare-earth element such as neodymium is easily affected by heat. Since the plasma used for a film forming process is a heat source, characteristics of the magnetic body 122 can be kept by controlling a temperature of the magnetic body 122. For example, the Curie temperature of neodymium is about 330° C.

Figure 18:
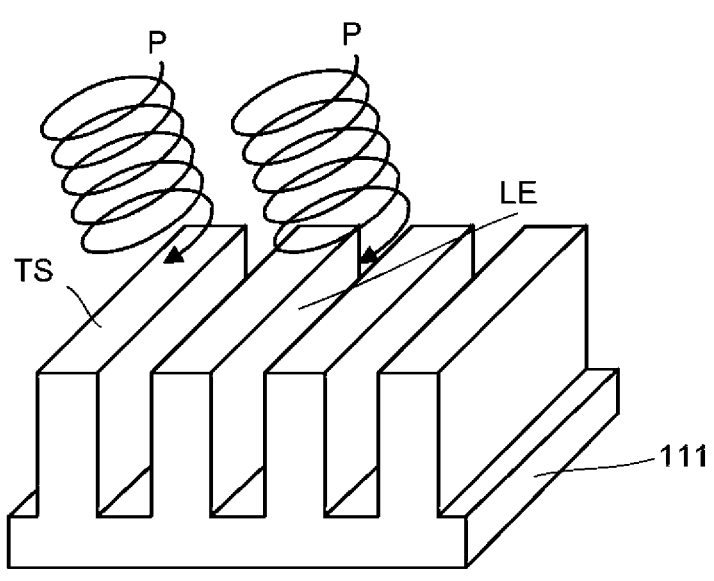
FIG. 18 is a schematic view illustrating a behavior of positive ions in the carbon film forming step when a magnetic body is provided.

FIG. 18 is a schematic view illustrating a behavior of positive ions P such as carbon ions in the carbon film forming step S2 when the magnetic body 122 is provided. When the magnetic body 122 is provided, the positive ions P are accelerated according to a magnetic field which is based on the magnetic force lines ML. A Lorentz force is applied to the accelerated positive ions P. The Lorentz force changes a motion of the positive ions P into a screw motion in accordance with the Fleming's left hand rule. That is, the positive ions P execute a screw motion moving in a screw form in a direction intersecting the surface of the electrode J2, as illustrated in FIG. 18. In this case, since the amount of the positive ions P having a sliding motion can increase more than those having a rectilinear motion, an accumulation amount of the positive ions P on the lateral surface LE with respect to the upper surface TS can be increased. It is noted that an angular velocity of a screw motion is proportional to a magnetic flux density of a magnetic body. Therefore, the screw motion increases as the magnetic flux density increases, and thus the amount of the positive ions P having a sliding motion can be increased more than those having a rectilinear motion.

The seventh embodiment may be appropriately combined with other embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A target processing device comprising:
a processing chamber;
a first supply source configured to supply at least one of a first ion including carbon or a first gas including carbon;
a second supply source configured to generate a second plasma from a second gas;
a transport unit configured to convey a target into the processing chamber; and
a control device configured to alternately perform a number of times a first operation of forming a film including carbon on the target disposed in the processing chamber using at least one of the first ion and a first plasma generated from the first gas and a second operation of removing the film by a chemical reaction between the second plasma and the film, while controlling the first and second supply sources and without removing the target from the processing chamber,
wherein the first supply source includes an arc ion source that generates the first ion by arc discharge and introduces the first ion into the processing chamber.

2. The target processing device according to claim 1, further comprising:
a first power source configured to supply a first voltage to the processing chamber;
a second power source configured to supply a second voltage to the processing chamber; and
a gas supply source configured to selectively introduce the first gas including carbon and the second gas into the processing chamber,
wherein the first operation includes introducing the first gas from the gas supply source to the processing chamber, generating the first ion from the first gas by supplying the first voltage from the first power source to the processing chamber, and subsequently stopping the supply of the first voltage and the introduction of the first gas, and
wherein the second operation includes introducing the second gas from the gas supply source to the processing chamber, generating the second plasma from the second gas by supplying the second voltage from the second power source to the processing chamber, and subsequently stopping the supply of the second voltage and the introduction of the second gas.

3. The target processing device according to claim 1, wherein the second supply source includes a remote plasma source that generates the second plasma from the second gas and introduces the second plasma into the processing chamber.

4. The target processing device according to claim 1, wherein the first operation is performed by locating a ferromagnetic body below the target, the ferromagnetic body having unipolarity in a direction substantially parallel to a bottom surface of the target.

5. The target processing device according to claim 1, wherein the transport unit is a robot and the processing chamber includes a conveyance port through which the target is conveyed into and removed from the processing chamber.

6. The target processing device according to claim 5, wherein the conveyance port is open when the target is conveyed into and removed from the processing chamber and closed during the first and second operations.

7. The target processing device according to claim 1, wherein the target is a photomask or a template.

8. A target processing device comprising:
a processing chamber;
a first supply source configured to supply at least one of a first ion including carbon or a first gas including carbon;
a second supply source configured to generate a second plasma from a second gas;
a transport unit configured to convey a target into the processing chamber; and
a control device configured to alternately perform a number of times a first operation of forming a film including carbon on the target disposed in the processing chamber using at least one of the first ion and a first plasma generated from the first gas and a second operation of removing the film by a chemical reaction between the second plasma and the film, while controlling the first and second supply sources and without removing the target from the processing chamber, wherein the first operation is performed by locating a ferromagnetic body below the target, the ferromagnetic body having unipolarity in a direction substantially parallel to a bottom surface of the target.

5

* * * * *